(12) United States Patent
Ueda

(10) Patent No.: US 6,657,238 B2
(45) Date of Patent: Dec. 2, 2003

(54) LIGHT EMITTING DIODE AND ILLUMINATOR USING THE SAME

(75) Inventor: Takashi Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/057,825

(22) Filed: Jan. 24, 2002

(65) Prior Publication Data

US 2002/0121644 A1 Sep. 5, 2002

(30) Foreign Application Priority Data

Jan. 25, 2001 (JP) ......................................... 2001-017221

(51) Int. Cl.[7] ............................................. H01L 29/22
(52) U.S. Cl. .............................. 257/99; 257/80; 257/81; 257/82; 257/100
(58) Field of Search ............................ 257/79, 80, 81, 257/82, 99, 100

(56) References Cited

U.S. PATENT DOCUMENTS

| | | | |
|---|---|---|---|
| 3,893,229 A | * 7/1975 | Aird ............................. 257/82 |
| 4,948,960 A | * 8/1990 | Simms et al. .......... 250/227.11 |
| 5,475,241 A | * 12/1995 | Harrah et al. ................... 257/99 |
| 5,760,422 A | 6/1998 | Ishinaga | |
| 5,877,558 A | * 3/1999 | Nakamura et al. ........... 257/431 |
| 6,121,635 A | * 9/2000 | Watanabe et al. ............ 257/102 |
| 6,350,997 B1 | * 2/2002 | Saeki ........................... 257/102 |
| 6,420,731 B1 | * 7/2002 | Katayama et al. ............. 257/17 |
| 6,426,512 B1 | * 7/2002 | Ito et al. ........................ 257/12 |
| 2002/0088981 A1 | * 12/2001 | Suzuki .......................... 257/79 |
| 2002/0123164 A1 | * 1/2002 | Slater et al. ................... 438/39 |

FOREIGN PATENT DOCUMENTS

JP 62174980 A * 7/1987 ........... H01L/33/00

* cited by examiner

Primary Examiner—Minh Laon Tran
Assistant Examiner—Pershelle Greene
(74) Attorney, Agent, or Firm—Merchant & Gould P.C.

(57) ABSTRACT

An illuminator includes a first terminal, a second terminal, and a light emitting diode mounted on the first terminal and electrically connected to the second terminal. The light emitting diode includes a chip body, a lower electrode formed on a lower surface of the chip body, and an upper electrode formed on an upper surface of the chip body. The chip body includes an n-type semiconductor layer, a p-type semiconductor layer, and a light emitting layer interposed therebetween. The upper electrode is formed entirely over the upper surface of the chip electrode.

6 Claims, 7 Drawing Sheets

LIGHT EMITTING DIODE AND ILLUMINATOR USING THE SAME

TECHNICAL FIELD

The present invention relates to a light emitting diode (LED) used as a general-purpose light source, as a back lighter for the pushbuttons of a mobile phone, or as a light emitting element of a photointerrupter for example. The present invention also relates to an illuminator using such an LED.

BACKGROUND ART

As shown in FIG. 5, a typical LED basically includes a chip body 10, a lower electrode 4 formed entirely over a lower surface of the chip body 10 and an upper electrode 105 formed on an upper surface of the chip body 10. The chip body 10 includes an n-type (or p-type) semiconductor layer 1, a p-type (or n-type) semiconductor layer 2, and a light emitting layer (active layer) 3 interposed therebetween. The chip body 10 is rectangular as viewed in plan and has a predetermined thickness. When energized, light emitted from the light emitting layer 3 travels outward through the upper surface and the side surfaces of the chip body 10. The lower electrode 4 is made of Au which has a good conductivity and is formed over the entire lower surface of the chip body 10. Similarly to the lower electrode 4, the upper electrode 105 is made of Au and generally has a thickness of about 1 μm. The upper electrode 105 covers only a central portion of the upper surface of the chip body 10 so that light can be emitted upward through the upper surface of the chip body 10.

Generally, the LED has a laminated structure of gallium-arsenic compound layers such as GaAlAs layer. Specifically, the LED is formed by preparing a semiconductor wafer by successively forming, on a substrate, a p-type GaAlAs semiconductor layer, a GaAlAs light emitting layer and an n-type GaAlAs semiconductor layer by epitaxial growth, forming an lower electrode 4 and an upper electrode 105 on the semiconductor wafer, and dividing the wafer into chips by dicing. At this time, the upper electrode 105 is provided by forming an Au film entirely over a surface of the semiconductor wafer and then etching the Au film into a predetermined configuration (typically circular).

FIG. 6 illustrates the structure of a typical illuminator using an LED. The LED illuminator may be used as a light source for example. The LED illuminator includes a first lead T1 connected to the lower electrode 4 of the LED, a second lead T2 connected to the upper electrode 105 of the LED via a wire W, and a light-permeable resin package P. The resin package P entirely seals the LED and the wire W while partially sealing the first lead T1 and the second lead T2.

The resin package P may often formed of a light-permeable epoxy resin which does not contain a filler, because it is relatively inexpensive and can be easily hardened by heating to provide the package. The resin package P is formed by setting the LED, the wire W, the first lead T1 and the second lead T2 in a cavity of a predetermined configuration defined by a mold, injecting the melted epoxy resin into the cavity, and heating the resin for hardening.

In using the LED illuminator, power is applied across the first lead T1 and the second lead T2 to turn on the LED. At this time, the LED is heated due to the light emission, thereby heating the resin package P therearound. Since the light-permeable epoxy rein which does not contain a filler has a considerably large coefficient of linear expansion, the resin package P thermally expands due to the heat.

As described above, in the LED, the upper electrode 105 covers only the central portion of the upper surface of the chip body 10. Thus, the upper surface of the chip body 10 is partially exposed for contact with the resin package P. Moreover, the gallium-arsenic compounds forming the chip body 10 are more fragile than silicon which is used for forming general semiconductor chips.

Therefore, the LED may break when the exposed portion of the upper surface of the chip body 10 is pressed by the package P. Particularly, the p-type (or n-type) semiconductor layer 2 has edge portions 2a which suffer strains due to the stresses generated in cutting the wafer and hence are likely to break. As the breakage of the chip body 10 progresses during the use, the light-emittable region gradually becomes smaller, thereby deteriorating the brightness of the LED.

Such a breakage of the chip body 10 may also occur in forming the resin package P. Specifically, when a melted epoxy resin is injected in a cavity and heated for hardening, the epoxy resin thermally expands in the cavity to press the LED 100. As a result, the chip body 10 may break from the edge portions 2a of the p-type (or n-type) semiconductor 2.

The breakage of the chip body 10 may be prevented by subjecting the LED to mesa treatment for solubly removing the edge portions 2a, 2b, or by covering the LED with a cushion C within the resin package P as shown in FIG. 7. However, such a method makes the manufacturing process complicated, thereby deteriorating the manufacturing efficiency of the LED and the LED illuminator.

Moreover, although the light emitting layer 3 is formed over the entire horizontal section of the chip body 10, the upper electrode 105 covers the upper surface of the chip body 10 only partially. Therefore, the current density relative to the planar area of the chip body 10 is low, which leads to a low luminous efficiency of the LED as a whole. Therefore, to obtain a desired amount of light, the LED or the LED illuminator cannot be decreased in size.

DISCLOSURE OF THE INVENTION

An object of the present invention is to provide an LED which is capable of preventing the brightness from deteriorating without lowering the manufacturing efficiency and which can be made compact.

Another object of the present invention is to provide an illuminator utilizing such an LED.

According to a first aspect of the present invention, there is provided a light emitting diode comprising a chip body including an n-type semiconductor layer, a p-type semiconductor layer and a light emitting layer interposed therebetween, a lower electrode formed on a lower surface of the chip body, and an upper electrode formed on an upper surface of the chip body. The upper electrode is formed entirely over the upper surface of the chip body.

Preferably, the upper electrode is formed of gold.

In the LED having the above-described structure, the upper electrode is formed entirely over the upper surface of the chip body so that the current density relative to the planar area of the chip body is high. Therefore, although the light is emitted only through the side surfaces of the chip body, the light emitting efficiency of the LED as a whole can be enhanced. As a result, the LED and the illuminator using the LED can be made compact.

Moreover, in the LED, the upper surface (particularly at the edge portions) of the chip body, which is likely to break, is covered with the upper electrode for protection. Therefore, unlike the prior art, the breakage of the LED in use can be prevented without chamfering the edge portions of the upper surface of the chip body by mesa treatment or without forming a cushion for protecting the LED in making an LED illuminator. Therefore, it is possible to prevent a reduction of the light-emittable region. As a result, the degradation of the brightness can be prevented without lowering the manufacturing efficiency of the LED and the LED illuminator.

According to a second aspect of the present invention, there is provided an illuminator comprising a first terminal, a second terminal, and a light emitting diode mounted on the first terminal and electrically connected to the second terminal. The light emitting diode comprises a chip body including an n-type semiconductor layer, a p-type semiconductor layer and a light emitting layer interposed therebetween, a lower electrode formed on a lower surface of the chip body and an upper electrode formed on an upper surface of the chip body. The upper electrode is formed entirely over the upper surface of the chip body.

Preferably, the upper electrode is formed of gold, and the upper electrode is connected to the second terminal via a wire.

The illuminator may further comprise a light-permeable resin package for sealing the light emitting diode and the wire and part of the first and the second terminals.

Preferably, the first terminal has an upper end formed with a recess for accommodating the light emitting diode. The recess flares upward.

Other features and advantages of the present invention will become clearer from the description of the embodiment given below with reference to the accompanying drawings.

DETAILED DESCRIPTION OF THE PREFERRED EMBODIMENTS

A preferred embodiment of the present invention will be described below with reference to the accompanying drawings. Throughout the drawings, the elements which are identical or similar are designated by the same reference signs.

Figure 1:
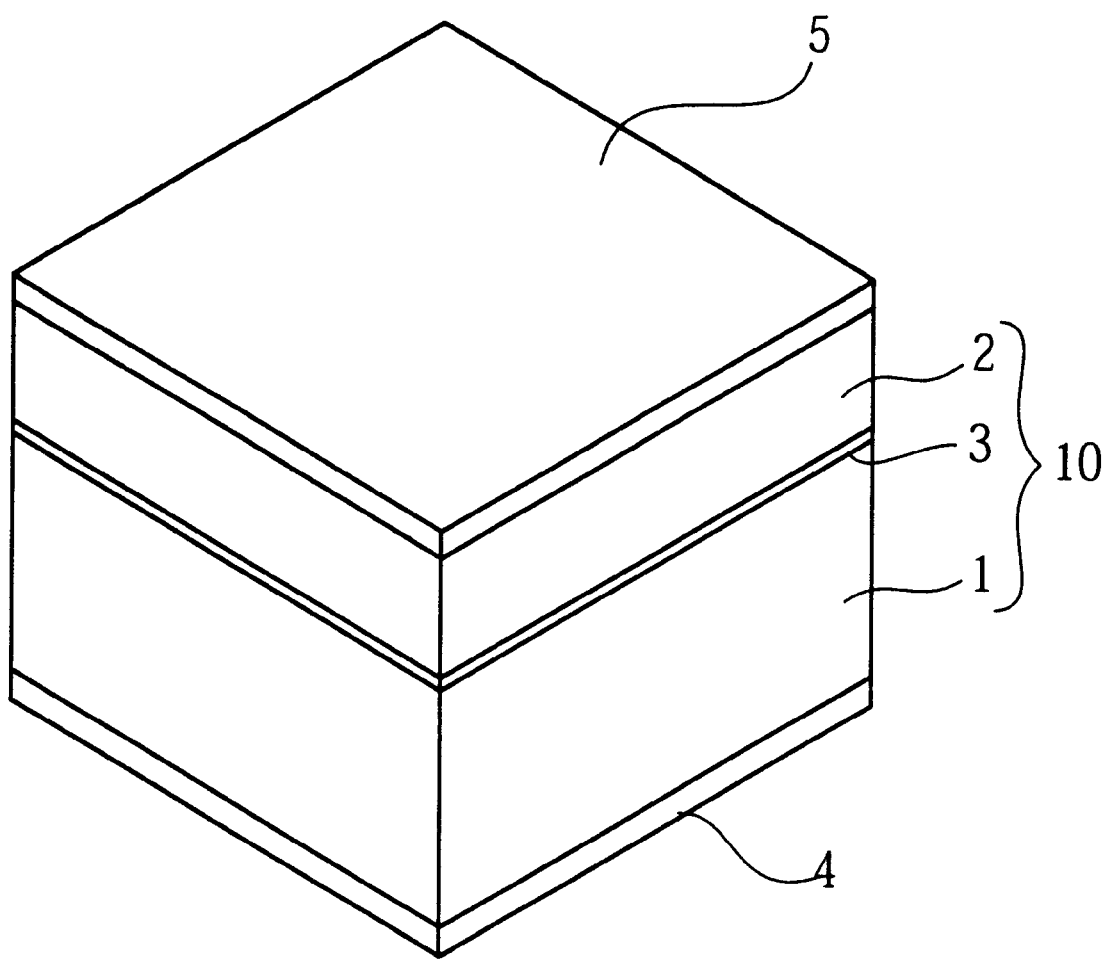
FIG. 1 is a schematic perspective view illustrating an LED embodying the present invention.

As shown in FIG. 1, an LED includes a chip body 10, a lower electrode 4 formed on a lower surface of the chip body 10, and an upper electrode 5 formed on an upper surface of the chip body 10. The chip body 10 includes an n-type (or p-type) semiconductor layer 1, a p-type (or n-type) semiconductor layer 2, and a light emitting layer (active layer) 3 interposed therebetween.

In this embodiment, the lower electrode 4 is made of a material having a good conductivity such as Au and is formed over the entire lower surface of the chip body 10.

Similarly to the lower electrode 4, the upper electrode 5 is made of a material having a good conductivity such as Au and is formed over the entire upper surface of the chip body 10.

The chip body 10 is rectangular as viewed in plan and has a predetermined thickness. When energized, light emitted from the light emitting layer 3 travels outward only through the side surfaces of the chip body 10.

Figure 2A:
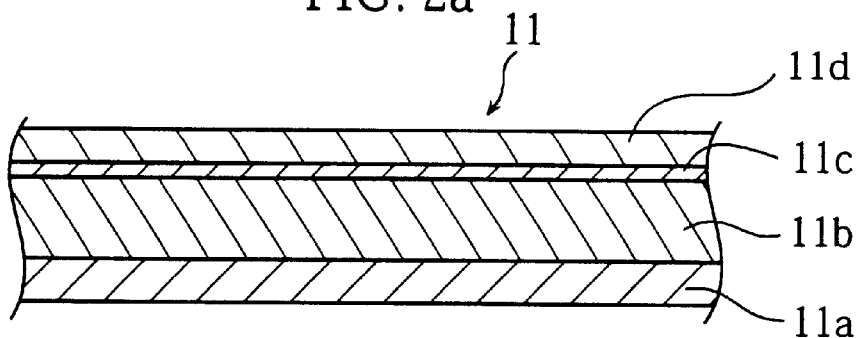
FIGS. 2a–2d illustrates successive process steps for manufacturing the LED.
Figure 2B:
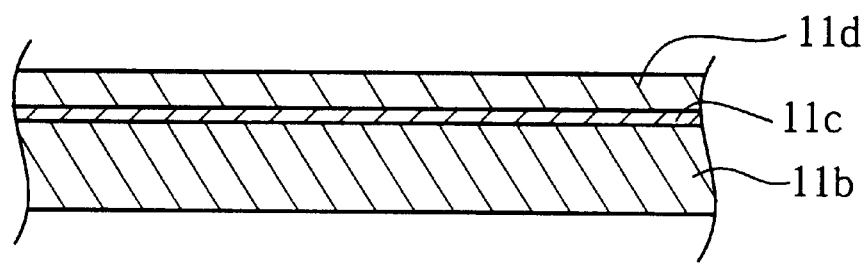
Figure 2C:
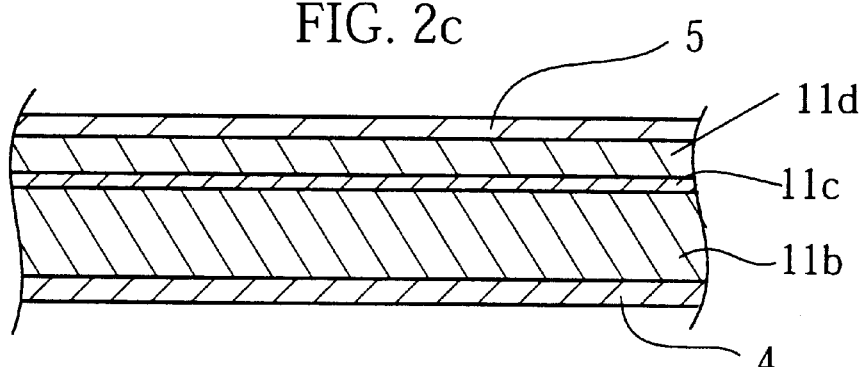
Figure 2D:
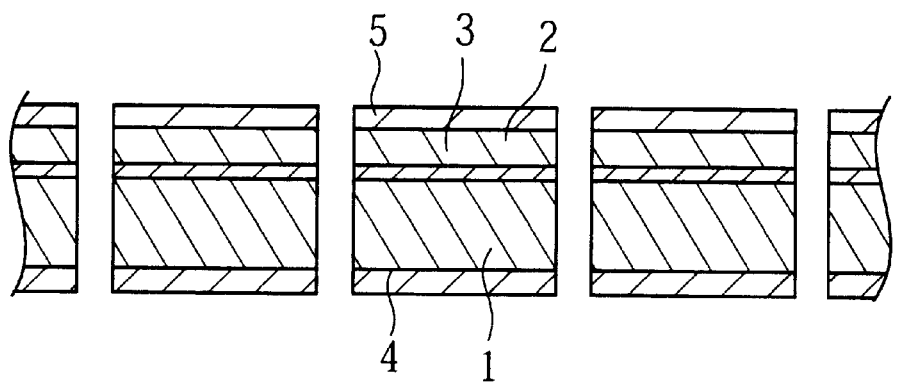

The LED is made of a gallium-arsenic compound such as GaAlAs, which is a typical material for making LEDs, by the following manufacturing process. First, as shown in FIG. 2a, a semiconductor wafer 11 is prepared by successively forming, on a surface of a GaAs crystalline substrate 11a, a p-type GaAlAs clad layer 11b, a GaAlAs light emitting layer 11c, and an n-type GaAlAs clad layer 11d by epitaxial growth. Subsequently, as shown in FIG. 2b, the GaAs crystalline substrate 11a is removed. Then, as shown in FIG. 2c, a lower electrode 4 and an upper electrode 5 are formed. Preferably, the upper electrode 5 may be formed to have a thickness of several $\mu$m to less than 20 $\mu$m. Finally, as shown in FIG. 2d, the semiconductor wafer 11 is divided by dicing into a plurality of LED chips.

The upper electrode 5 is formed just by forming an Au film entirely over the upper surface of the semiconductor wafer 11. Therefore, unlike the prior art, the process step for etching the Au film into a desired configuration is not necessary. Therefore, the manufacturing efficiency of the LED can be enhanced.

As described above, in the LED thus formed, the upper electrode 5 is provided on the entire upper surface of the chip body 10. Therefore, the current density relative to the planar area of the chip body 10 is high, which leads to an enhanced light emitting efficiency of the LED. As a result, the LED and an illuminator using the LED can be reduced in size.

Figure 3:
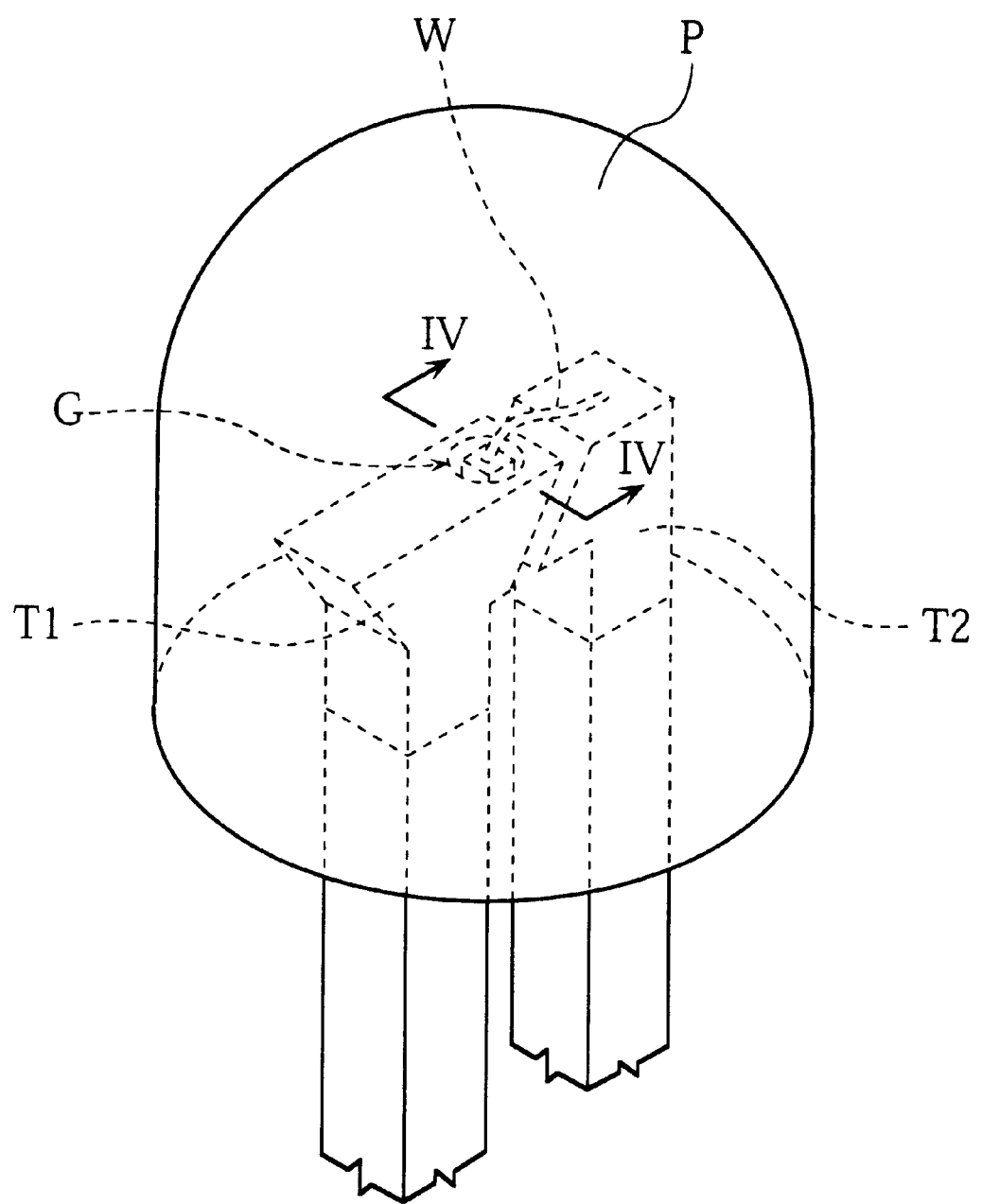
FIG. 3 is a schematic perspective view showing an example of illuminator incorporating the LED.

Next, the structure of an LED illuminator using such an LED will be described with reference to FIGS. 3 and 4.

The illustrated LED illuminator is used as a light source for example. The LED illuminator includes a first lead T1 connected to the lower electrode 4 of the LED, a second lead T2 connected to the upper electrode 5 of the LED via a wire W, and a light-permeable resin package P. The resin package P entirely seals the LED and the wire W while partially sealing the first lead T1 and the second lead T2.

The first lead T1 extends outward from the resin package P for connection to an external power circuit (not shown). Similarly, the second lead T2 extends outward from the resin package P for connection to a non-illustrated external power circuit. The first lead T1 and the second lead T2 are obtained from a lead frame prepared by punching a metal plate of copper or iron for example. The mounting of the LED to the first lead T1, the connection of the wire W to the second lead T2, and the formation of the resin package P are performed before the leads T1, T2 are separated from the lead frame.

Figure 4:
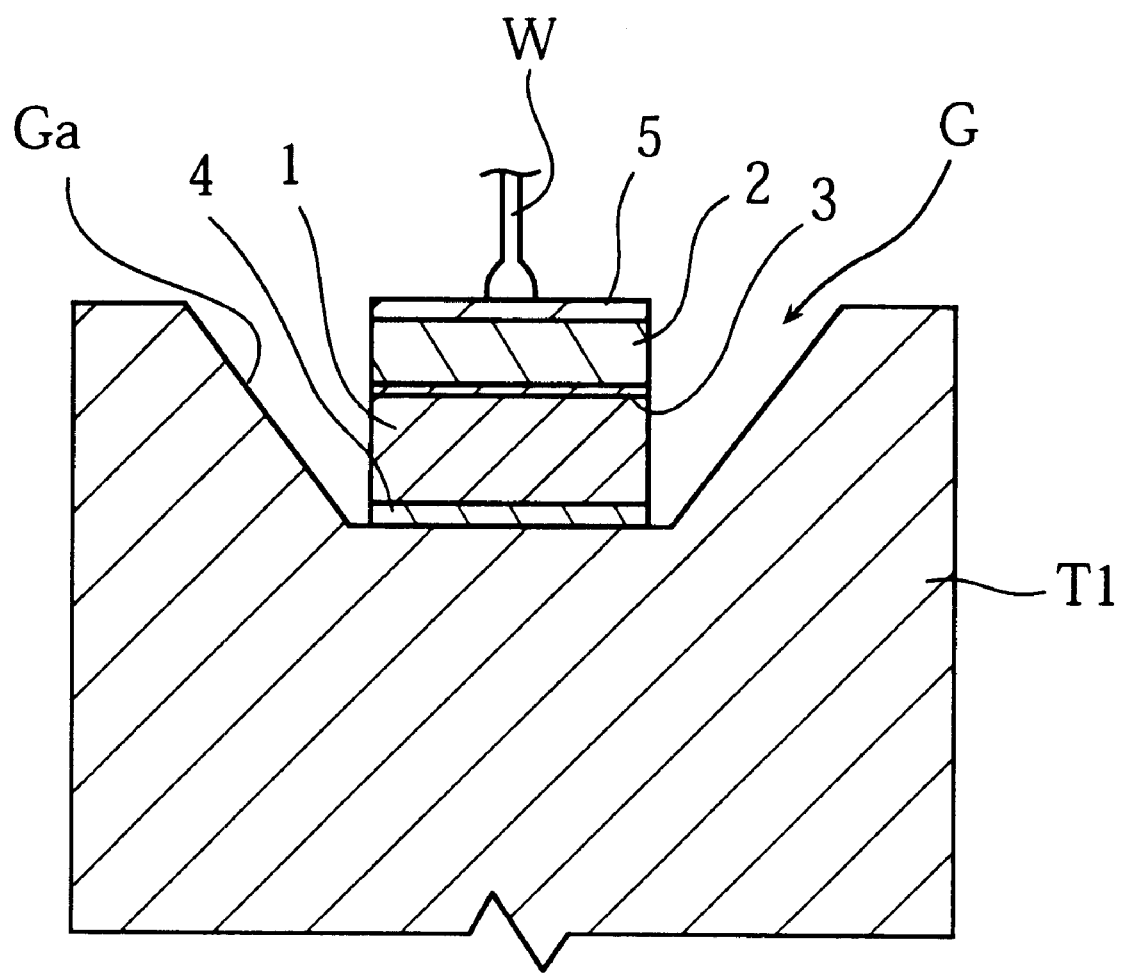
FIG. 4 is a sectional view taken along lines IV—IV in FIG. 3.

As clearly shown in FIG. 4, the first lead T1 has an upper end formed with a recess G which flares upward. The LED is mounted onto the bottom surface of the recess G. The recess G has an inclined wall surface Ga for upwardly reflecting light emitted through the side surfaces of the chip body 10, thereby effectively utilizing the light emitted from the light emitting layer 3.

In mounting the LED to the upper end of the first lead T1, the lower electrode 4 is bonded to a predetermined portion of the bottom surface of the recess G. As a result, the LED is electrically connected to the first lead T1 and is mechanically supported on the first lead T1.

On the other hand, the upper electrode 5 is connected, at the generally central portion thereof, to the wire W connected to the second lead T2. Specifically, the wire W is bonded to the upper electrode 5 by the so-called ball bonding and bonded to the second lead T2 by the so-called stitch bonding.

Figure 5:
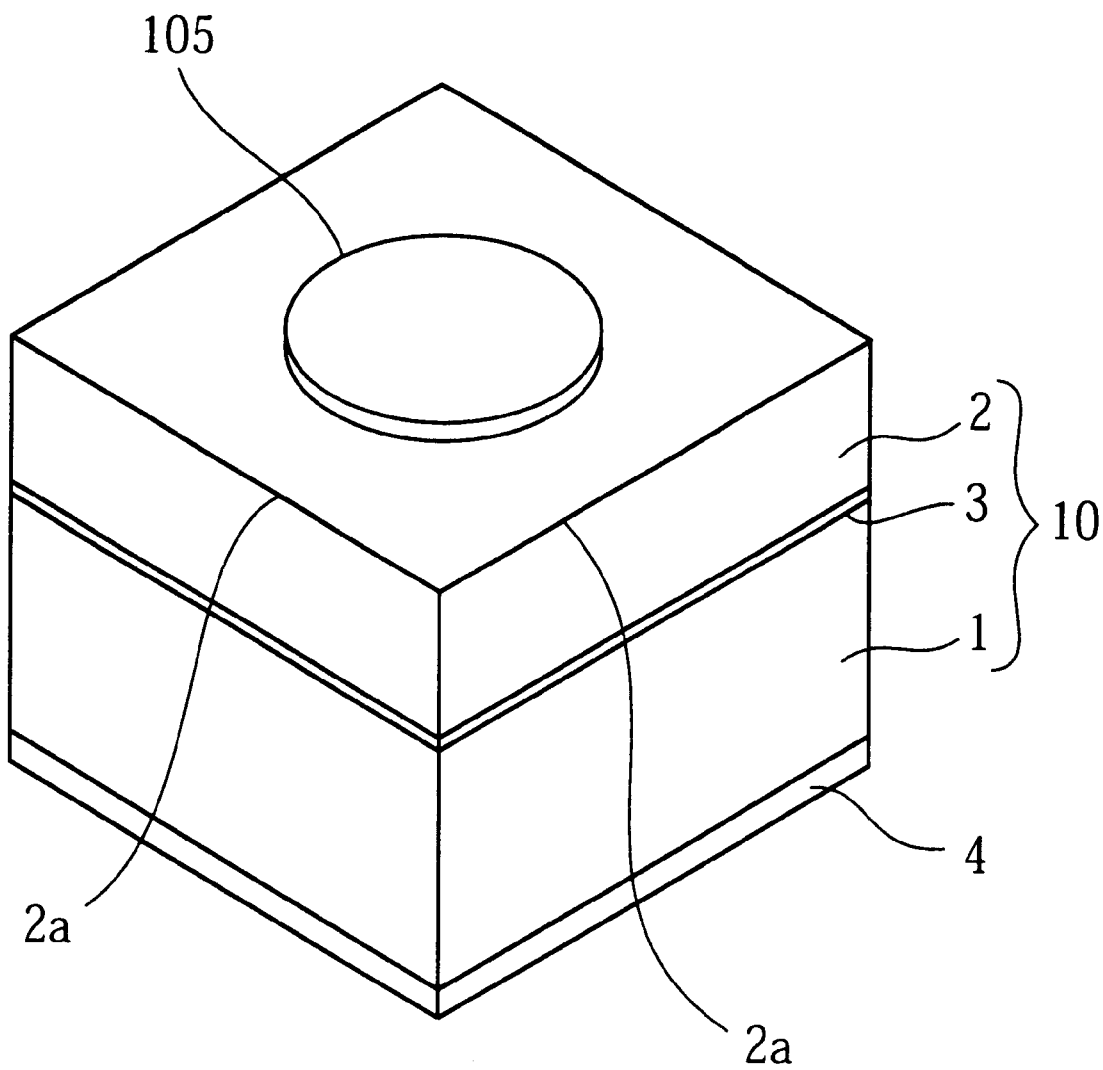
FIG. 5 is a schematic perspective view illustrating an example of prior art LED.
Figure 6:
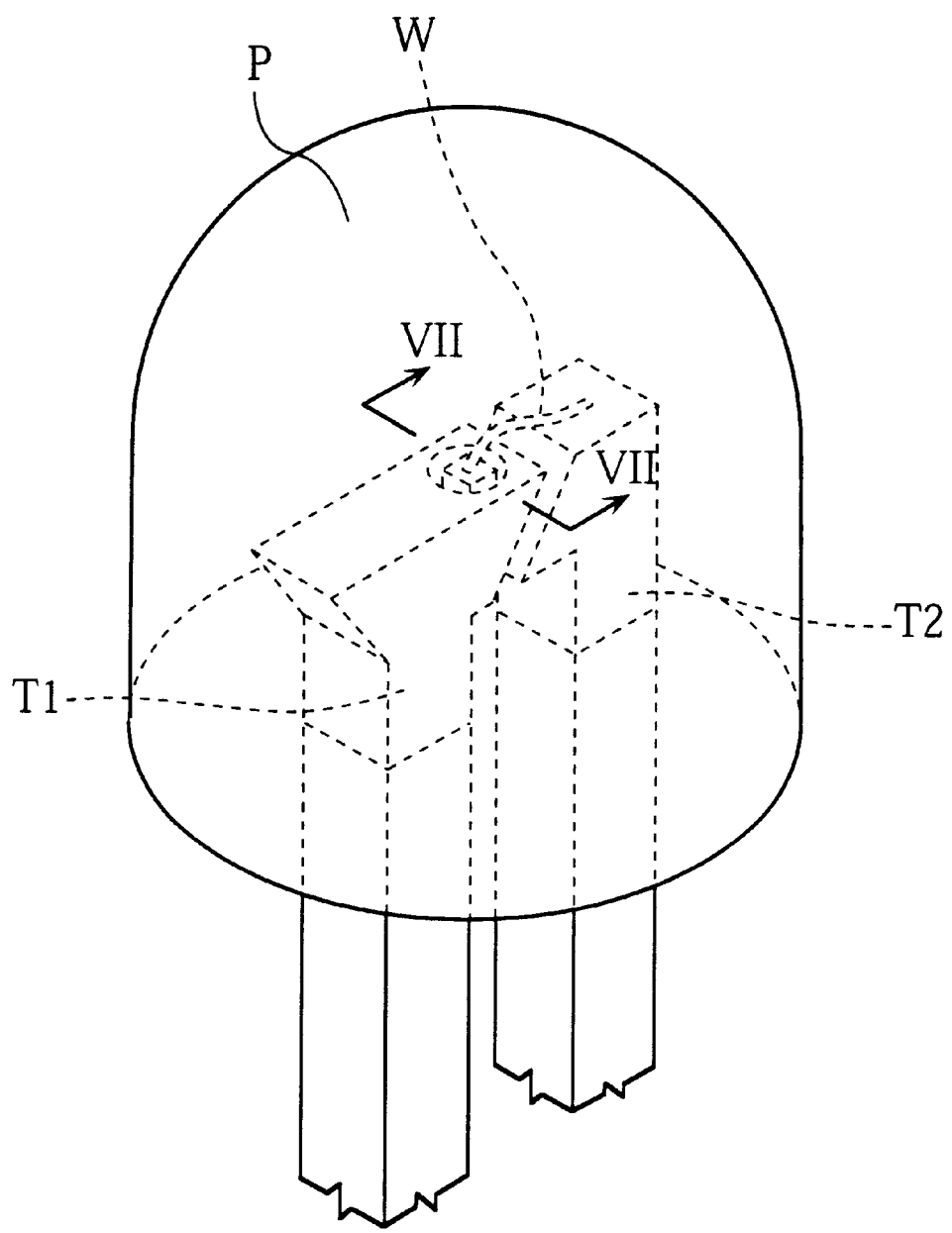
FIG. 6 is a schematic perspective view illustrating an example of illuminator incorporating the prior art LED.
Figure 7:
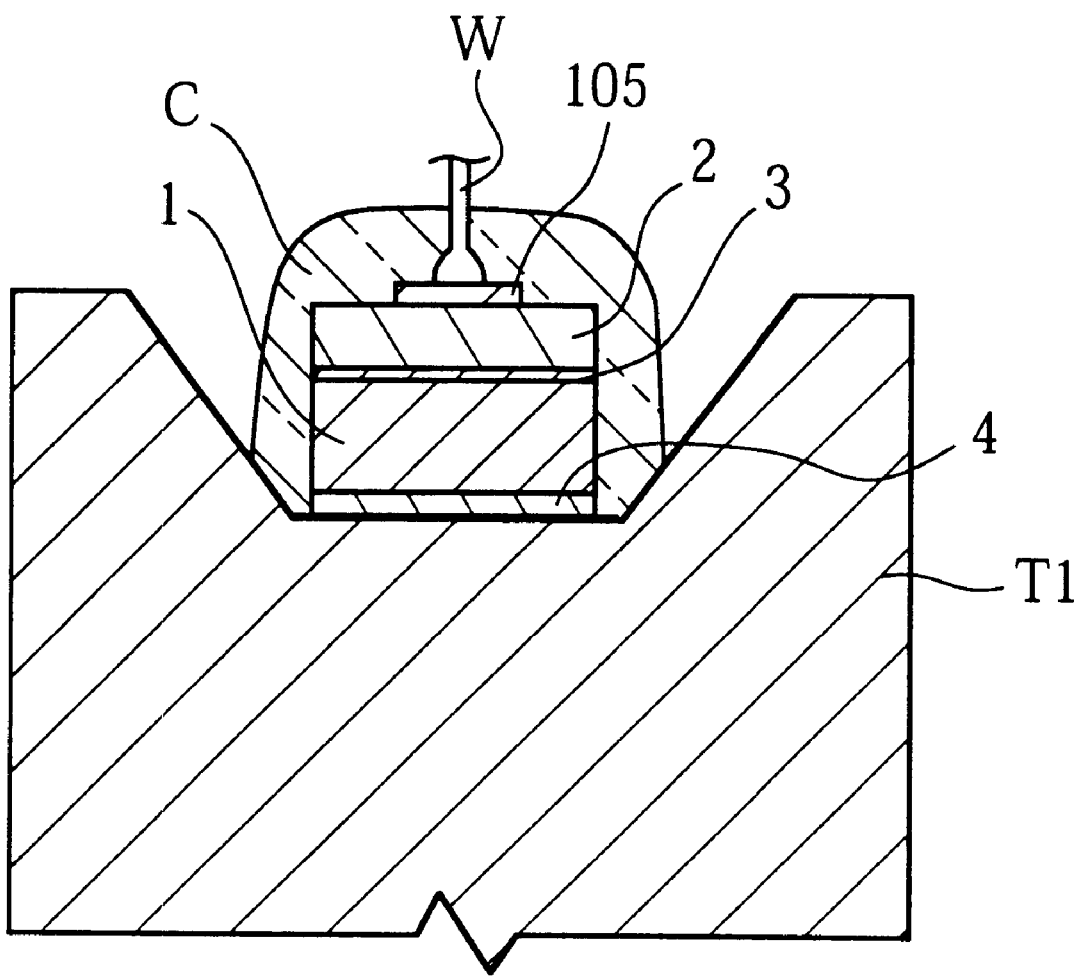
FIG. 7 is a sectional view taken along lines VII—VII in FIG. 6.

As described before, unlike the LED shown in FIG. 5, the upper electrode 5 is formed entirely over the upper surface of the chip body 10. Therefore, in performing the ball bonding, a capillary (not shown) for holding the wire W need not be precisely positioned, which facilitates the wire bonding process.

The resin package P may often be formed of a light-permeable epoxy resin which does not contain a filler, because it is relatively inexpensive and can be easily hardened by heating to provide the package. The resin package P is formed by setting the LED, the wire W, the first lead T1 and the second lead T2 in a cavity of a predetermined configuration defined by a mold, injecting the melted epoxy resin into the cavity, and heating the resin for hardening.

In using the LED illuminator, heat is generated due to the light emission of the LED. Since the light-permeable epoxy rein which does not contain a filler has a considerably large coefficient of linear expansion, the resin package P thermally expands due to the heat, thereby pressing the LED. However, since the upper surface of the chip body 10 is entirely covered with the upper electrode 5, the upper surface (particularly edge portions) of the chip body 10 is protected from the pressing force of the epoxy resin. Therefore, unlike the prior art, the breakage of the chip body 10 can be prevented without performing mesa treatment or without forming a cushion for protecting the LED. Particularly, in this embodiment, the upper electrode 5 is formed of Au which is relatively soft, so that the chip body 10 can be reliably prevented from breaking. Therefore, it is possible to prevent a reduction of the light-emittable region of the LED during the use and to prevent the brightness from deteriorating.

The present invention is not limited to the embodiment described above. For example, the configuration and dimension of the two leads T1, T2 and the resin package P may be modified in various ways.

What is claimed is:

1. An illuminator comprising a first terminal, a second terminal, and a light emitting diode mounted on the first terminal and electrically connected to the second terminal, the light emitting diode comprising:

a chip body including an n-type semiconductor clad layer, a p-type semiconductor clad layer and a light emitting layer interposed therebetween, the chip body having side surfaces;

a lower electrode formed on a lower surface of the chip body; and an uppermost electrode formed on an upper surface of the chip body;

the uppermost electrode being formed entirely over the upper surface of the chip body;

the chip body emitting light only through the side surfaces;

wherein the first terminal has an end formed with an outwardly flaring recess for receiving the light emitting diode, the recess having a bottom surface for supporting contact with the lower electrode of the chip body, the recess further having an inclined surface facing the side surfaces of the light emitting diode for reflecting the light from the side surfaces away from the bottom surface of the recess.

2. The illuminator according to claim 1, wherein the uppermost electrode is formed of gold.

3. The illuminator according to claim 1, wherein the uppermost electrode is connected to the second terminal via a wire.

4. The illuminator according to claim 3, further comprising a light-permeable resin package for sealing the light emitting diode and the wire and part of the first and the second terminals.

5. The illuminator according to claim 1, wherein the first terminal has an upper end formed with the recess, the recess flaring upward.

6. The illuminator according to claim 1, wherein the uppermost electrode is entirely flat.

\* \* \* \* \*